United States Patent
Milkovic

[11] 3,947,763
[45] Mar. 30, 1976

[54] C-MOS ELECTRONIC KWH METER AND METHOD FOR METERING ELECTRICAL ENERGY

[75] Inventor: Miran Milkovic, Scotia, N.Y.

[73] Assignee: General Electric Company, Schenectady, N.Y.

[22] Filed: May 30, 1974

[21] Appl. No.: 474,519

[52] U.S. Cl. .............................................. 324/142
[51] Int. Cl.² ..................... G01R 7/00; G01R 11/32
[58] Field of Search ...................... 324/142; 235/194

[56] References Cited
UNITED STATES PATENTS

| | | | |
|---|---|---|---|
| 3,500,200 | 3/1970 | Woodhead | 324/142 |
| 3,510,772 | 5/1970 | Luthi | 324/142 |
| 3,525,042 | 8/1970 | Nunlist et al. | 324/142 |
| 3,794,917 | 2/1974 | Martin et al. | 324/142 |
| 3,818,340 | 6/1974 | Yamaguchi | 324/142 |

FOREIGN PATENTS OR APPLICATIONS

| | | | |
|---|---|---|---|
| 472,677 | 6/1969 | Switzerland | 324/142 |
| 801,200 | 12/1968 | Canada | 324/142 |

OTHER PUBLICATIONS
Friedl et al., "Portable Electronic Watthour Meter," Standard, Published Versions of Lectures Given During the Sept. 1972, IEE Metering Conference in London, England, Paper No. 117.

Primary Examiner—Stanley T. Krawczewicz
Attorney, Agent, or Firm—Vale P. Myles

[57] ABSTRACT

Metering kWh in an electrical system is accomplished by generating pairs of analog signals, representing current and voltage variables. Each pair of analog signals is multiplied together in a direct pulse-width conversion in a time-division multiplier network. A constant amplitude triangular generator is associated with the multiplier and the multiplier is implemented using C-MOS technology. A separate direct pulse-width multiplier network is provided for multiplying without introducing any phase shift each of the pairs of analog signals to form a series of width and amplitude-modulated pulse signals. The series of modulated pulse signals is converted in, for example, a low-pass filter to a signal having an amplitude representative of average power. For polyphase systems, the signals delivered from each of the multiplier channels are summed at the low-pass filter. An analog-to-pulse rate converter is used for converting the signal representing average power to another series of output pulse signals having a variable signal repetition rate proportional to average power, each output pulse signal representing a quantized amount of electrical energy. A stepping switch and register perform conventional accumulation, storage and display functions in response to the series of output pulse signals delivered thereto.

14 Claims, 6 Drawing Figures

C-MOS ELECTRONIC KWH METER AND METHOD FOR METERING ELECTRICAL ENERGY

CROSS REFERENCES TO RELATED PATENT APPLICATIONS

A related copending U.S. Pat. application, Ser. No. 361,030, filed May 17, 1973, in behalf of inventor-applicant M. Milkovic, titled ELECTRONIC METERING OF ACTIVE ELECTRICAL ENERGY (kWh) (R.D.-5417), now U.S. Pat. No. 3,875,509, discloses and claims a method and apparatus for metering kWh in polyphase systems.

Another related copending U.S. Pat. application, Ser. No. 395,142, filed Sept. 7, 1973, in behalf of inventor-applicant M. Milkovic, titled METERING ELECTRICAL ENERGY (kWh) IN SINGLE PHASE SYSTEMS (R.D.-6569), now U.S. Pat. No. 3,875,508, discloses and claims a method and apparatus for metering electrical energy in single phase systems. The aforesaid M. Milkovic is the same inventor-applicant in whose behalf this patent application is filed.

The entire right, title and interest in and to the inventions described in the aforesaid patent applications, as well as in and to the aforementioned patent applications and the entire right, title and interest in and to the invention hereinafter disclosed, as well as in and to the patent application of which this specification is a part, are assigned to the same assignee.

BACKGROUND OF THE INVENTION

This invention pertains generally to metering active electrical energy by solid state electronic techniques and, in particular, in one aspect relates to an improved multiplier and method for multiplying analog signals representative of current and voltage in the electrical system whose energy is being metered.

Electrical energy (kWh) has been and continues to be metered with the familiar rotating disc-type of meter. In addition, the instrumentation and metering arts include proposed systems having apparatus employing electronic and solid state devices for measuring power and energy. In such apparatus, the electronic and solid state devices replace the conventional rotating disc.

Further, there is disclosed and claimed in applicant's copending applications referred to above, apparatus and methods for metering electrical energy in an electrical system which involves producing analog signals from line currents and voltages. Pairs of analog signals, representing current and voltage variables, are processed in time-division multiplier networks which multiply the analog signals to produce a series of width and amplitude-modulated pulse signals, each representing instantaneous partial power. Pulse signals from different multiplier networks are summed to provide another series of pulse signals, each representing instantaneous total power. The series of pulse signals representing instantaneous total power are processed through a low-pass filter to produce another signal representative of average total power in the system. Subsequently, the signal representing average total power is processed in an analog-to-pulse rate converter which produces a series of output pulse signals, each representing a quantized amount of electrical energy. A stepping switch and register perform conventional accumulation, storage and display functions in response to the series of output pulse signals delivered thereto.

The multipliers used in the above-referenced copending patent applications are described therein as feedback-type up-down integration multipliers, which combine the analog input signals to produce a series of output pulses in accordance with a sampling frequency with the output pulses being amplitude and width-modulated in accordance with the input analog signals. As known to those in the art, such feedback type of multipliers inherently produce phase shift errors in the pulse with and heighth-modulated output signals, with the amount of phase shift errors being related to the rate of the sampling frequency compared to the frequency of the input analog signals.

At an ordinary sampling frequency of 10 kHz a pulse-width-amplitude multiplier phase shift is about 1.5° at a 60 Hz signal frequency. This phase shift of 1.5° can result in a multiplier error of about 5 percent if the phase shift between two input analog signals being multiplied amounts to 60° (power factor equal to 0.5).

Accordingly, it is one object of the present invention to provide a method and apparatus for use in a solid state electrical energy metering system for multiplying electrical analog signals representing voltage and current in the system to produce a series of amplitude and width-modulated pulses without the introduction of phase shift errors.

It is another object of this invention to provide such a multiplier apparatus and method utilizing solid state circuitry which may be fabricated in the form of monolithic integrated structures.

It is another object of this invention to provide an improved triangle wave generator and method for use with the multiplier apparatus and method of this invention.

Briefly, in accordance with one embodiment of the invention, there is provided an electronic kWh meter which includes means for developing pairs of analog signals representative of currents and voltages in the electrical system being monitored. The current and voltage analog signals in a pair are multiplied in a direct-type pulse modulator, which does not generate any internal phase shift, and which functions to multiply the two analog signals and produce a series of width and amplitude-modulated pulse signals, each representing instantaneous power. If the electrical system being monitored is a polyphase system, so that a plurality of multipliers are provided, then the pulse signals from the different multiplier networks are summed to provide another series of pulse signals, each representing instantaneous total power. The series of pulse signals representing instantaneous total power are processed through a low-pass summing filter which produces another signal representative of average total power in the system. The averge total power signal is processed in a quantizing analog-to-pulse rate converter which produces a series of output pulse signals each representing a quantized amount of electrical energy. A stepping switch and register perform conventional accumulation, storage and display functions in response to the series of output pulse signals delivered thereto.

Other objects, as well as various features of the invention, appear hereinafter from the description of the preferred embodiments taken in due consideration in connection with the drawings.

DESCRIPTION OF THE PREFERRED EMBODIMENTS

Figure 1:
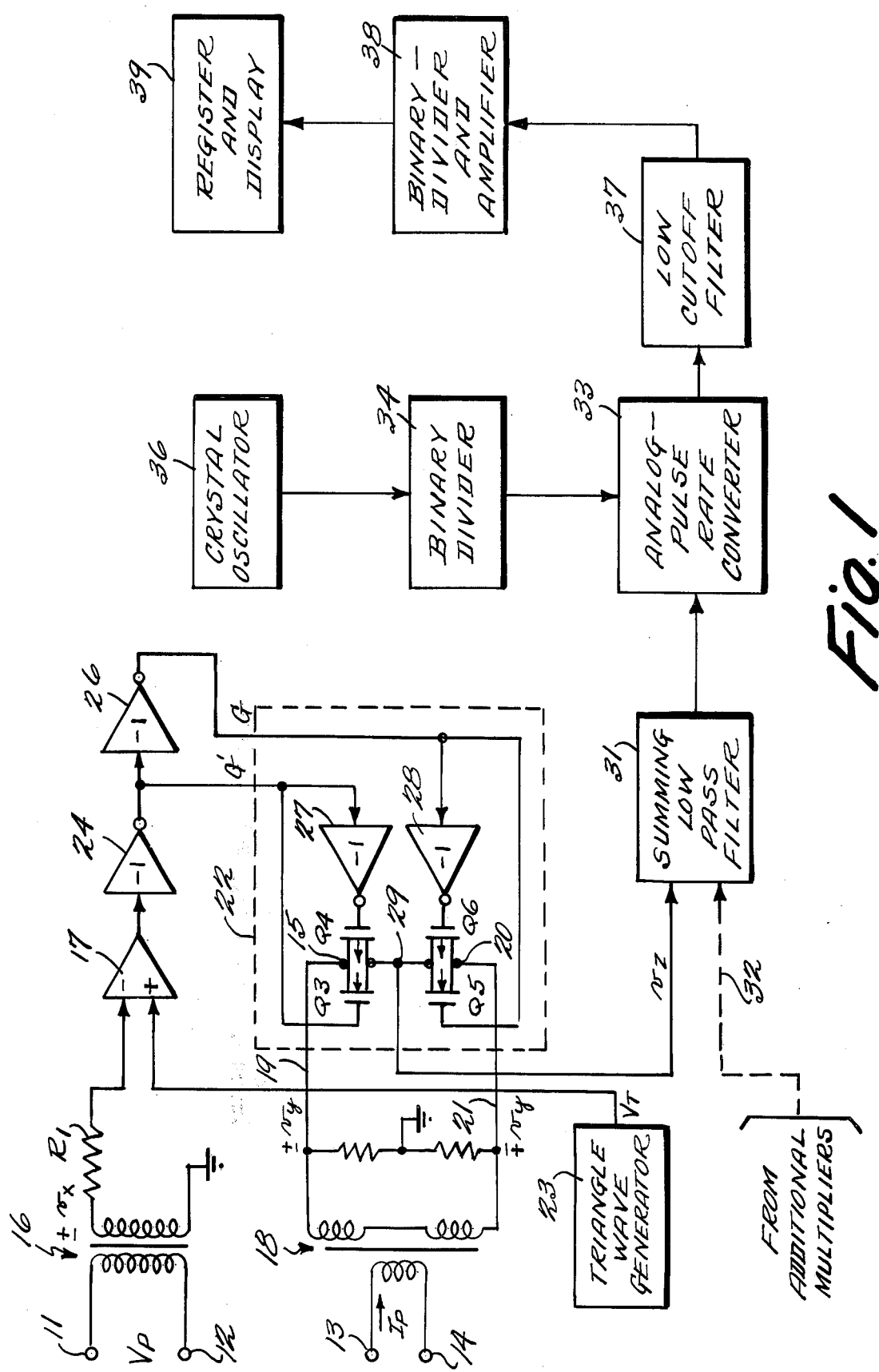
FIG. 1 is a schematic illustration of one embodiment of the invention in an overall system for electronically metering electrical energy.

Turning now to a description of the various preferred embodiments of the invention, there is shown in FIG. 1 a diagrammatic illustration of one embodiment of the invention illustrated in combination with a number of electronic circuits in an overall system for measuring power and energy. The present invention is applicable to active electrical energy metering in a single or polyphase electrical phase system. Using the methodology of Blondel's Theorem, various parts of signals are developed with one of the signals in a pair being proportional to a line current and another of the signals in the pair bein proportional to a line voltage. This methodology or technique and the number of pairs of signals which must be developed to measure the total power in a system having any particular number of phases is fully explained in copending patent application Ser. No. 361,030, filed May 17, 1973, and Ser. No. 396,142, filed Sept. 7, 1973, the disclosures of which are thereby incorporated by reference.

In FIG. 1 there is shown a pair of input terminals 11 and 12 to which a line voltage $V_p$ is applied. Similarly, there is shown a pair of input terminals 13 and 14 to which a line current $I_p$ is applied. The line voltage $V_p$ is transformed by a potential transformer 16 to a first analog signal $\pm v_x$ which is applied through a resistor R1 to an input of a comparator 17. The line current $I_p$ is transformed by a current transformer 18 and appears as analog voltages $\pm v_y$ appearing across resistor R2 and an analog voltage $\mp v_y$ (180° out of phase with $\pm v_y$) appearing across resistor R3. The analog signals $\pm v_y$ and $\mp v_y$ form inputs on circuits 19 and 21 to input terminals 15 and 20, respectively, of a bipolar switch 22.

The comparator 17 also receives as an input a cyclically varying reference signal $V_T$ from a triangle wave generator 23. The outut of the comparator 17 is a linear superposition of the input signals $\pm v_x$ and $V_T$ which is applied to an inverter 24. The output of the inverter 24 is a signal labeled G' which forms a control input to the bipolar switch 22 and which is also applied to an additional inverter 26. The output of the inverter 26 is a signal labeled G which also forms a control input to the bipolar switch 22.

Figure 2:
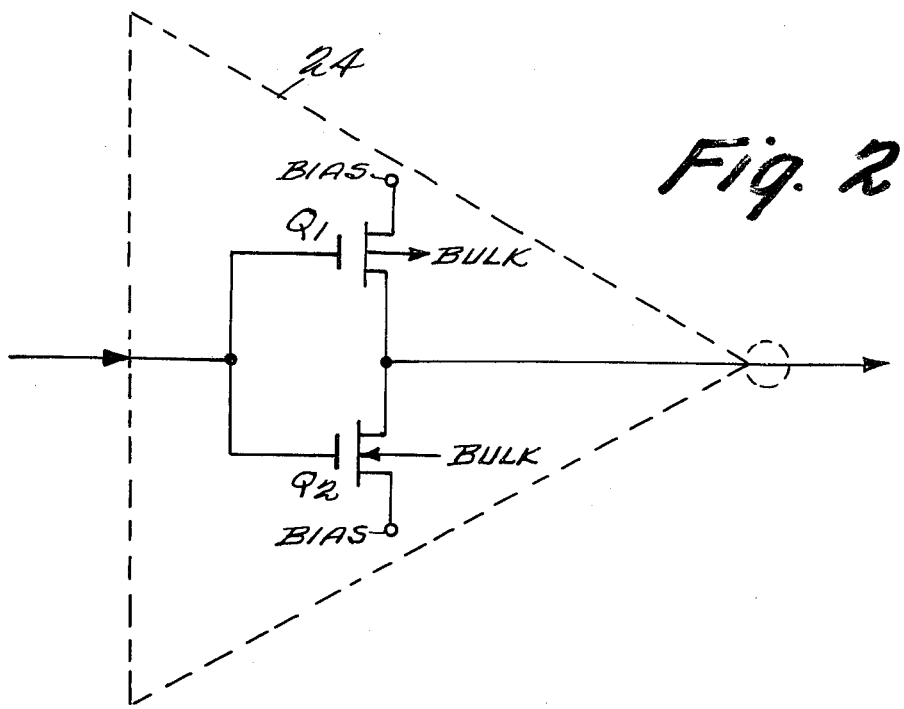
FIG. 2 is a typical schematic diagram for the inverters shown in block diagram form in FIG. 1.

The inverter 24 is of the form shown in FIG. 2 comprising a pair of complementary MOS field effect transistors Q1 and Q2, which can be conveniently fabricated in monolithic integrated circuit form. The transistors may include bulk connections to the semi-conductor substrate as schematically indicated in FIG. 2 for minimizing capacitance in the very low power consumption inverter. The construction of inverter 26 is identical to that of 24 so that details of the construction of inverter 26 are not illustrated.

The bipolar switch 22 includes a first pair of complementary MOS field effect transistors Q3 and Q4, functioning as a first switching element, and a second pair of complementary MOS field effect transistors Q5 and Q6, functioning as a second switching element. Transistor Q3 receives at its gate the signal G' and transistor Q4 receives at its gate the signal G' phase shifted 180° by an inverter 27 so as to be in phase with the signal G. Transistor Q5 receives at its gate the signal G and transistor Q6 receives at its gate the signal G phase shifted 180° by an inverter 28 so as to be in phase with the signal G'.

When the signal G is "high" or positive (so that G' is correspondingly "low" or negative), the transistors Q5 and Q6 are turned "on" or are conducting, so that the signal $\mp v_y$ is coupled to the output terminal 29. In a similar fashion, if the signal G is low (so that G' is high), then transistors Q3 and Q4 are conducting and the signal $\pm v_y$ is coupled to the output terminal 29.

Transistors Q3 and Q4 are complementary enhancement mode MOD field effect transistors with transistor Q3 being an N-channel transistor and transistor Q4 being a P-channel transistor. Similarly, the transistors Q5 and Q6 are complementary MOS field effect transistors with transistor Q5 being an N-channel device and transistor Q6 being a P-channel device. The transistor Q3 through Q6 act as switches for switching the analog $v_y$ at the output terminal 29 to form the output $v_z$ in accordance with the width-modulated pulse train G (and G').

Figure 3A:
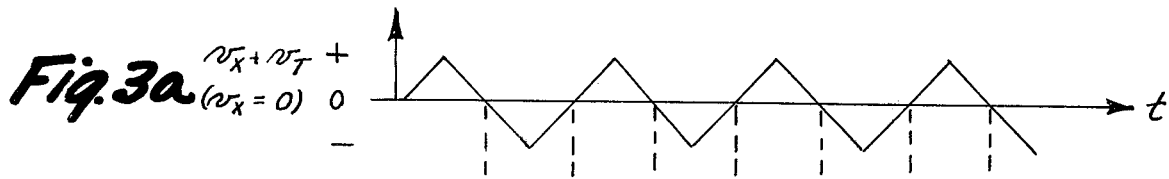
FIGS. 3a through 3f show signal waveforms at various points in the multiplier of FIG. 1 for varying input signal conditions.
Figure 3B:
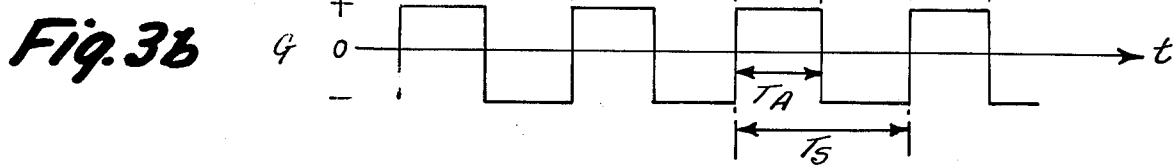

The operation of the multiplier arrangement to produce an output signal $v_z$ comprising a series of pulses width-modulated in accordance with one of the analog signals ($v_x$) and amplitude-modulated in accordance with the other analog signal ($v_y$) can best be illustrated by referring to the waveforms shown in FIGS. 3a through 3f. FIG. 3a is a plot of the superimposed signals $v_x$ and $V_T$ at the input of the comparator 17 for the case where the one analog signal $v_x = 0$. In this instance, the comparator receives only the reference signal $V_T$ which is a triangular wave as shown in FIG. 3a having a frequency $f_s$. The output G of inverter 26 for the case where $v_x = 0$ is shown in FIG. 3b. As can be seen from an inspection of FIG. 3b, the output G is a symmetrical pulse train of the same frequency $f_s$ determined by the triangular reference wave generator 23. The signal G', which is not specifically shown in FIG. 2 at the output of the inverter 24, is a pulse train symmetrical to that shown in FIG. 3b, except that it is 180° out of phase with the pulse train shown in FIG. 3b. The duty cycle or ratio $T_A/T_S$ as indicated on the pulse train in FIG. 3b is given by the following equation.

$$\frac{T_A}{T_S} = \tfrac{1}{2}\left(1 - \frac{v_x}{V_T}\right)$$

Figure 3C:
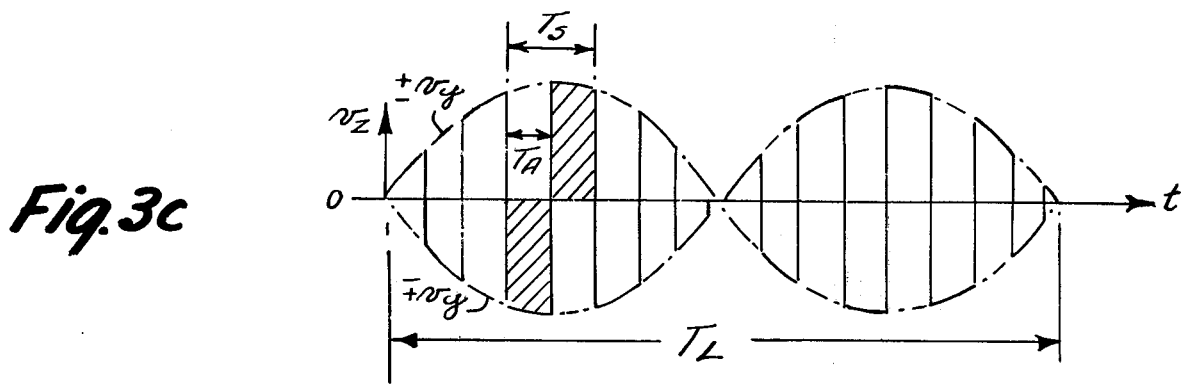

The switch comprised of transistors Q3 through Q6 is controlled by the signals G and G' and receives as inputs the second analog signals $\pm v_y$ and $\mp v_y$. The signal $v_z$ forming the output of the bipolar switch 22 is thus a series of pulses which are pulse width-modulated in accordance with the pulse width of the signals G and G', which are amplitude-modulated in accordance with the amplitude variations of the analog signal $v_y$. A waveform of the output $v_z$ of the bipolar switch 22 for the case where $v_x = 0$ is shown in FIG. 3c. Utilizing equation 1 the instantaneous value of $v_z$ over the time period $T_S$ is expressed as follows.

$$v_z = \frac{1}{T_S} \int_0^{T_S} v_y \left(\frac{2T_A}{T_S} - 1\right) dt = -\frac{v_x v_y}{V_T}$$

Figure 3D:
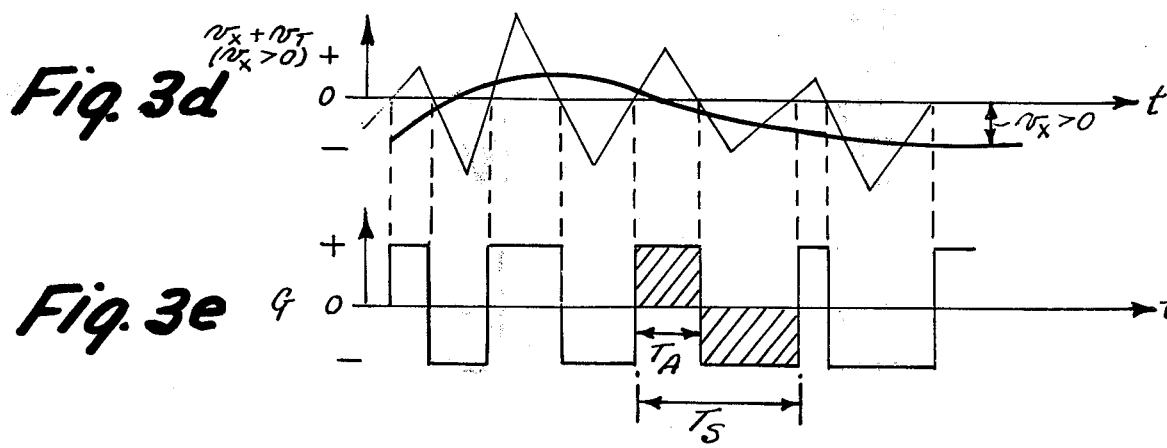
Figure 3E:
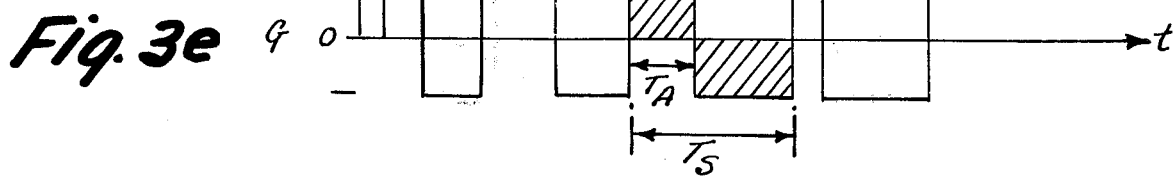

FIG. 3d is a plot of the value of $v_x + V_T$ for the case where $v_x > 0$ and the two signals have been linearly superimposed at the comparator 17. FIG. 3e shows the signal G at the output of the inverter 26 for the superimposed signals shown in FIG. 3d. As can be seen in FIG. 3e the signal G is pulse width-modulated in accordance with the variations of the analog signal $v_x$.

Figure 3F:
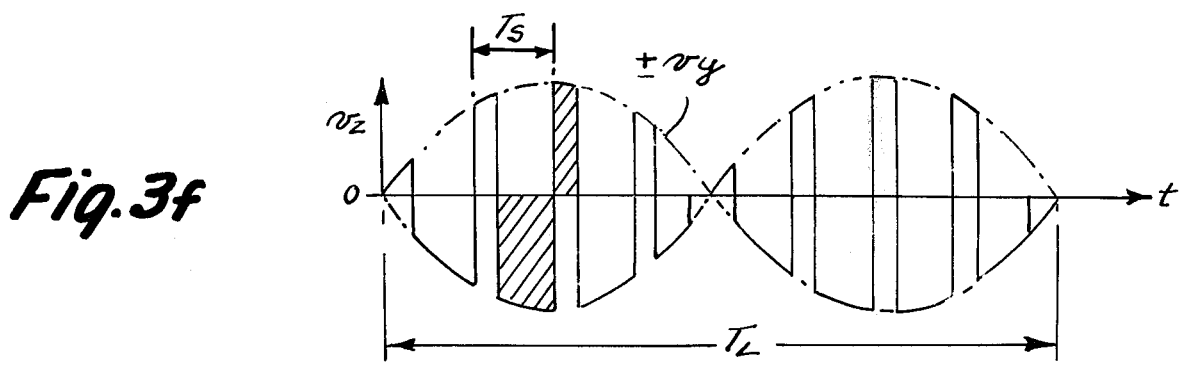

FIG. 3f is a waveform similar to FIG. 3c but for the case where the analog signal $v_x > 0$, as discussed above in connection with FIGS. 3e and 3d. As can be seen from an inspection of FIG. 3f, the output signal $v_z$ is a series of pulses whose pulse width is modulated in accordance with the variations of the analog signal $v_x$ and whose amplitude is modulated in accordance with the variations of the analog signal $v_y$.

As illustrated in FIG. 1, the output $v_z$ of the bipolar switch 22 forms an input to a summing lowpass filter 31. If the electrical system whose energy is being metered is a polyphase system so that a plurality of multipliers are provided for multiplying respective pairs of analog signals, then the signals from these additional multipliers also form inputs to the summing low-pass filter 31. This is schematically illustrated in FIG. 1 by the circuit 32 shown in dashed lines.

In the arrangement shown in FIG. 1, after the integration of the instantaneous values of $v_z$ over a period $T_L$, the signal $V_F$ at the output of low-pass summing filter 31 is given by
Equation 3

$$V_F = K_1 V_p I_p \cos \theta = K_2 P$$

where $K_1$ and $K_2$ are dimensional constants, $\theta$ is the phase angle between $V_p$ an $I_p$, $p$ is the active power and $V_p$ and $I_p$ are RMS values of the signals at the input terminals 11 and 12 and 13 and 14.

The function of the analog-to-pulse rate converter 33 is to integrate and to quantize the active power (P), which active power is proportional to the signal $V_F$. The analog-to-pulse rate converter 33 can have associated therewith a binary divider 34 driven by a crystal oscillator 36 as fully explained in copending application Serial No. 361,030. Also, as fully explained in said copending application, the output of the analog-to-pulse rate converter 33 is a pulse train where each pulse represents a quantized amount of energy given by the expression
Equation 4

$$W_q = K_3 P T_q$$

where $K_3$ is a dimensional constant and $T_q$ is quantization time. Thus, the analog-to-pulse converter 33 delivers a series, or train, of pulses at its output with the accumulated number of output pulses representing the total electrical energy of the system. The output of the analog-to-pulse rate converter 33 is coupled through a low cut-off filter 37 to the input of a binary divider and amplifier arrangement 38. The amplified output from the binary divider and amplifier 38 is coupled to a register and display unit 39 which accumulates pulses and operates a display to display in decimal digits, for example, the accumulated energy in kWh. Suitable circuitry for the elements illustrated in block diagram form in FIG. 1 is fully explained in the copending patent applications referred to hereinbefore.

In accordance with one embodiment of the invention, the triangular reference signal $V_T$ has a frequency $1/T_S$ of about 50 to 100 times the line frequency $1/T_L$ of $V_P$ and $I_P$. In accordance with one aspect of the invention, a very stable triangle wave generator 23 has been developed for use in association with the multiplier arrangement shown in FIG. 1.

Figure 4:
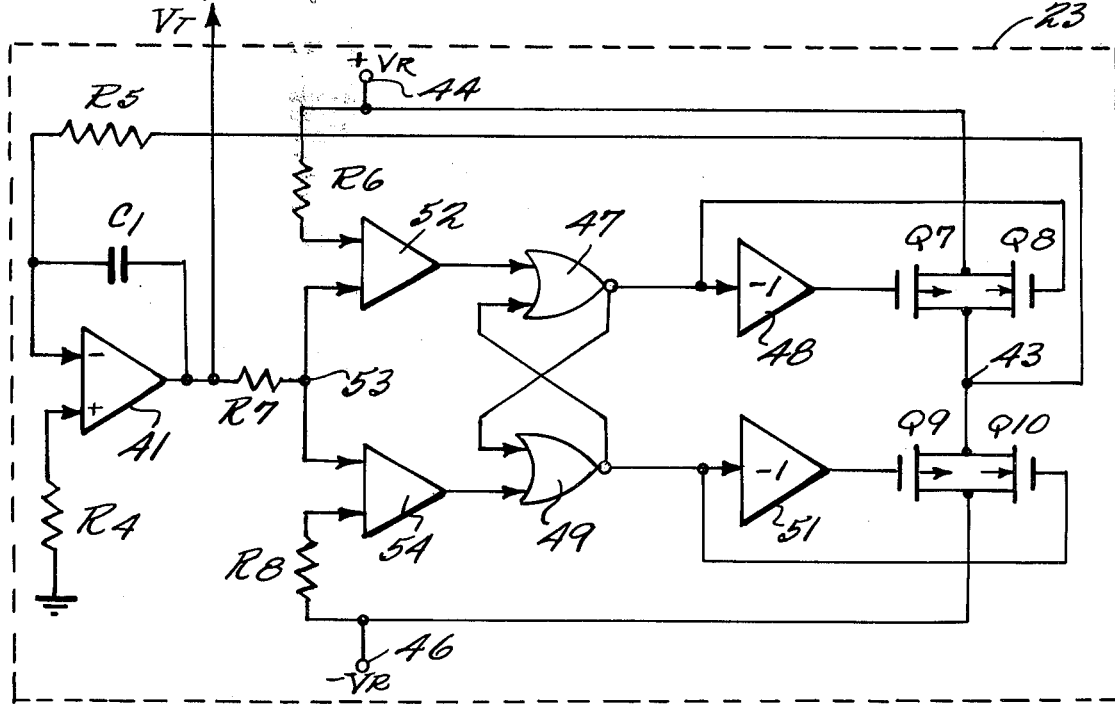
FIG. 4 is a schematic diagram of one form of reference signal generator for generating the reference signal $V_T$ in FIG. 1.

Referring to FIG. 4, the triangular wave generator 23 comprises an operational amplifier 41 having its non-inverting input connected through a resistor R4 to a reference potential such as ground and having a capacitor C1 connected between its inverting input and the output at a terminal 42. The inverting input of the operational amplifier 41 is also connected through a resistor R5 to the output at a terminal 43 of a bipolar switch comprising complementary MOS field effect transistors Q7 and Q8 and an additional pair of complementary field effect MOS transistors Q9 and Q10. A positive reference potential source $+V_R$ at a terminal 44 is switched to the output terminal 43 through the transistors Q7 and Q8 and in a similar fashion, a negative reference potential source $-V_R$ of identical magnitude to $+V_R$ at a terminal 46 is switched through the transistors Q9 and Q10 to the output terminal 43.

The transistors Q7 and Q8 are switched in accordance with the output of an NAND gate 47 which has its output directly connected to the gate of transistor Q8 (an N-channel MOS field effect transistor) and connected through an inverter 48 to the gate of P-channel type MOS transistor Q7. In a similar fashion, the switching of transistors Q9 and Q10 is connected in accordance with the output of an additional NAND gate 49 which is directly connected to the gate of transistor Q10 and which is connected through an inverter 51 to the gate of the P-channel type transistor Q9. A comparator 52 is provided which has one of its inputs connected through a resistor R6 to the positive reference voltage $+V_R$ and its other input connected to a terminal 53 which is connected through a resistor R7 to the terminal 42 at the output of the operational amplifier 41. The output of the comparator 52 forms one input to the NAND gate 47 with the other input to the NAND gate 47 being tied to the output of the NAND gate 49. In a similar fashion, a comparator 54 is provided which has one input connected through a resistor R8 to the negative source of reference potential $-V_R$ and which has its other input connected to the terminal 53. The output of the comparator 54 forms one input to the NAND gate 49 with the other input to the NAND gate 49 being tied to the output of the NAND gate 47.

In operation, with a constant input voltage to the inverting input of the operational amplifier 41 it functions as an integrator with the inverted time integral of the input voltage appearing at the output terminal 42. With a constant input voltage, the output at output terminal 42 is thus a ramp. By alternately switching the input to the integrator between equal amplitude positive and negative reference voltages $+V_R$ and $-V_R$, the signal $V_T$ appearing at terminal 42 is a triangular waveform as discussed hereinbefore in connection with FIG. 3a. Assuming, for example, that the output signal at terminal 42 is increasing to a positive voltage, when some predetermined positive voltage is reached the comparator 52, comparing this positive voltage to the voltage appearing at its other input connected through resistor R6 to $+ V_R$, generates a low output which is coupled to one of the inputs of the NAND gate 4. Assuming that the other NAND gate 49 has a high output, then if one input to the NAND gate 47 is low then its output is high. Its high output turns on transistors Q7 and Q8 which connect the positive source of reference voltage $+ V_R$ to the terminal 43 which is connected through resistor R5 to the inverting input of operational amplifier 41. At the same time both inputs to 49 are high and the output of 49 is low, thus Q9 and Q10 are turned off. When the output voltage 42 of the operational amplifier 41 reaches the negative reference level $-V_R$, the comparator 54 output goes low and since both outputs of the NAND gate 49 are low the output of 49 goes and turns on the transistors Q9 and Q10. At the same time both inputs of the NAND gate 47 are high thus the output goes low and turns off the transistors Q7 and Q8. The output of the operational amplifier 41 at terminal 42 thus increase in a ramp fashion towards a positive value. The above-described cycle repeats itself so that the signal $V_T$ appearing at the terminal 42 is a triangular wave formed by alternately switching the input to the integrator between equal amplitude positive and negative reference potentials.

It can be demonstrated that the amplitude of $V_T$ is essentially independent of the variation in values of resistor R5 and capacitor C1, or of any other component in the circuit for that matter, if the reference voltages $+ V_R$ and $- V_R$ are held constant. The relative variation of $V_T$ is given by $$\frac{dV_T}{V_T} \sim = - \frac{dV_R}{V_R} - \frac{dT_S}{T_S} + \frac{dR_s}{R_s} + \frac{dC_1}{C_1}$$

For $dV_R/V_R = 0$, any variation of R5 and/or C1 causes a compensating variation of $T_S$ (time period of one cycle of the triangular wave) in order to keep the quantity $dV_T/V_T = 0$. A variation of $T_S$ does not contribute any kind of significant error to the multiplier arrangement shown in FIG. 1.

Figure 5:
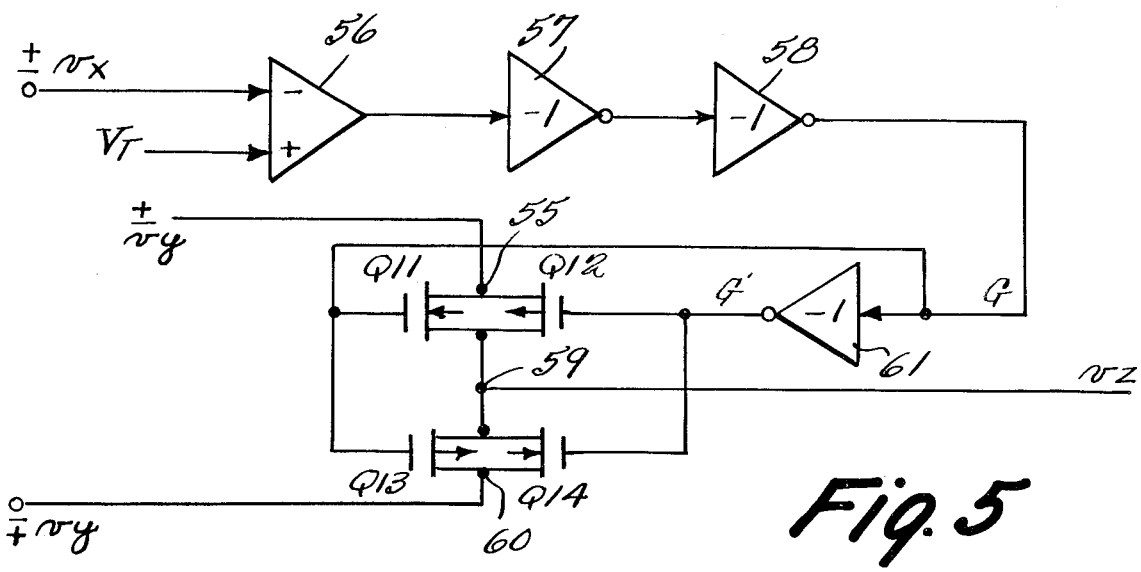
FIG. 5 is a schematic diagram of an alternate embodiment of a multiplier in accordance with the invention.

Turning now to a consideration of FIG. 4, there is shown a schematic circuit diagram of an alternate embodiment of the multiplier arrangement of the invention shown in FIG. 1, with this alternate embodiment not requiring a separate phase inversion of the control signal G, as is the case in the embodiment shown in FIG. 1. Referring to FIG. 5, the analog signals $\pm v_x$ together with $\pm v_y$ and $\mp v_y$ are developed as before. As before, the analog signal $\pm v_x$ and the reference triangular signal $V_T$ are linearly combined in a comparator 56 whose output is coupled through a first inverter 57 and a second inverter 58 to form the signal G. A bipolar switch is provided comprising a first switching element of a complementary pair of MOS field effect transistors Q11 and Q12, and a second switching element formed of an additional pair of complementary MOS field effect transistors Q13 and Q14. The bipolar switch has input terminals 55 and 60 to which the analog signals $\pm v_y$ and $\mp v_y$ are respectively applied. The output signal $v_z$ appears at an output terminal 59 of the bipolar switching arrangement. The signal G is coupled to the gates of N-channel transistor Q11 and P-channel transistor Q13. The output of an inverter 61, which is a G' signal 180° out of phase with G, is coupled to the gates of P-channel transistor Q12 and N-channel transistor Q14. With the arrangement shown in FIG. 5, when the signal G is high and G' is correspondingly low, transistors Q11 and Q12 are conducting or turned on. When the signal G is low, so that G' is correspondingly high, the transistors Q13 and Q14 are on transistors Q11 and Q12 are off. In this manner, the multiplier arrangement shown in FIG. 5 forms an output $v_z$ which is a pulse train in which the width of the pulses is modulated in accordance with the width of the pulses G, and in which the amplitude is modulated in accordance with the variations of the other analog signal $v_y$.

Figure 6:
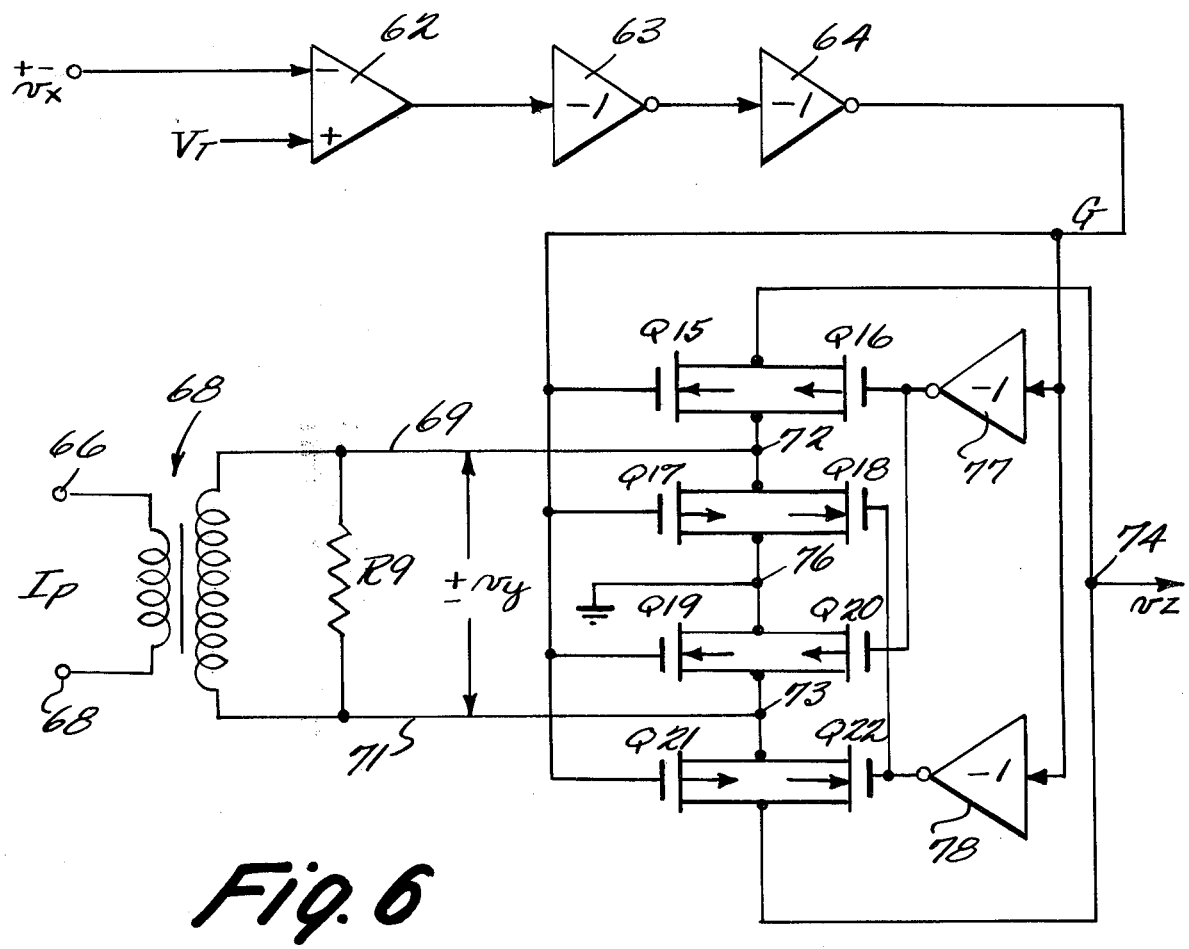
FIG. 6 is a schematic diagrm of an additional alternate embodiment of a multiplier in accordance with the invention.

Turning now to a consideration of FIG. 6, there is shown still a further embodiment of a multiplier arrangement in accordance with one embodiment of the invention. In accordance with the embodiment shown in FIG. 6, the necessity for obtaining from the current transformer 180° phase shifted signals $v_y$ is eliminated.

Turning now to a detailed consideration of FIG. 6, the first analog signal $\pm v_x$ and the reference signal $V_T$ are linearly superimposed in a comparator 62 with the output of the comparator 62 being coupled through inverters 63 and 64 to form the output signal G.

The line current $I_p$ at terminals 66 and 67 is coupled through a current transformer 68 and forms the additional analog signal $\pm v_y$ across the resistor R9. The signal $\pm v_y$ appearing across circuits 69 and 71 is applied to terminals 72 and 73, respectively, of a bipolar switching arrangement. The bipolar switching arrangement shown in FIG. 6 includes four switching elements each comprising a pair of complementary MOS field effect transistors. One pair of complementary transistors Q15 and Q16 are connected between an input terminal 72 and an output terminal 74; a second pair of complementary transistors Q17 and Q18 are connected together between the input terminal 72 and a reference potential terminal 76 (which may be connected to ground); a third pair of complementary transistors Q19 and Q20 are connected between the reference potential terminal 76 and the input terminal 73; and the last pair of complementary transistors Q21 and Q22 are connected together between the input terminal 73 and the output terminal 74. Transistors Q15, Q17, Q19 and Q21 have the signal G applied to their gates. Transistors Q16 and Q20 have a signal G' (180° out of phase with G) applied to their gates, which signal is derived by coupling the signal G through an inverter 77. The transistors Q18 and Q22 also have the signal G' applied to their gates, with the signal G' being obtained from an inverter 78 to which the signal G is coupled as an input.

In operation, it will be recalled that the signal G is a pulse train with the pulse width being modulated in accordance with the variations of the analog signal $\pm v_x$. The output signal $v_z$ formed at the output terminal 74 is a pulse train whose pulse widths are modulated in accordance with the variations of G and whose amplitudes are modulated in accordance with the variations in the second analog signal $\pm v_y$.

The bipolar switch arrangement function as follows. When the signal G is "high" or positive, transistors Q15 and Q16 are turned on and conduct, as do transistors Q19 and Q20. For this condition transistors Q17, Q18, Q21 and Q22 are off or not conducting. For this configuration the terminal 73 is coupled through conducting transistors Q19 and Q20 to terminal 76, which is at ground. The terminal 72 is coupled through conducting transistors Q15 and Q16 to the output terminal 74. The signal appearing at the output terminal 74 is thus amplitude-modulated in accordance with the variations in the signal $\pm v_y$.

If, on the other hand, the signal G is low, then transistors Q17 and Q18 are conducting, as are transistors Q21 and Q22. Transistors Q15, Q16, Q19 and Q20 are off or not conducting. For this situation, the terminal 72 is coupled through conducting transistors Q17 and Q18 to the terminal 76 which is at ground potential. The terminal 73 is coupled through conducting transistors Q21 and Q22 to the output terminal 74. Thus the output signal for this case $v_z$ (where G is low) is a signal whose amplitude is modulated in accordance with $\mp v_y$.

Thus, for the arrangement shown in FIG. 6, an output signal $v_z$ is obtained whose pulse width is modulated in accordance with the variations of $\pm v_z$ and whose amplitude is modulated in accordance with an additional analog signal $\pm v_y$. In the embodiment shown in FIG. 6, these two analog signals are multiplied in a bipolar switch arrangement with it not being necessary to supply to the bipolar switch arrangement 180° phase shifted signals $\pm v_y$ and $\mp v_y$.

While the method and apparatus of this invention have been described in connection with presently preferred embodiments, it should be obvious that modifications to the particularly disclosed embodiments are possible for one skilled in the art without departing from the true spirit and scope of the invention.

What is claimed is:

1. A method for metering electrical energy in a system comprising the steps of generating a first and a second analog signal, one of the first and second signals being proportional to a voltage and the other of the first and second analog signals being proportional to a current, generating a cyclically varying reference signal, comparing one of the first and second analog signals to the cyclically varying reference signal to generate a pulse train which is width-modulated in accordance with the comparison, coupling the other of the analog signals through a bipolar switch with the actuation of the bipolar switch being controlled by the width-modulated pulse train so that an output pulse train is formed at the bipolar switch output which is width-modulated in accordance with one of the analog signals and amplitude-modulated in accordance with the other of the analog signals.

2. A method in accordance with claim 1 including the step of converting the output pulse train of the bipolar switch in an analog-to-pulse rate converter into a series of output pulse signals wherein each pulse is representative of a quantized amount of electrical energy, and accumulating the pulses representative of a quantized amount of electrical energy.

3. An electronic kWh meter for metering electrical energy in a system comprising means for generating at least a first analog signal representative of a voltage or current in said system and at least a second analog signal representative of a current or voltage in the system; at least one multiplier for producing an output signal representative of the product of said at least first and second analog signals, said multiplier comprising means for generating a cyclically varying reference signal, comparator means for linearly superimposing said reference signal and said first analog signal to form a pulse train which is width-modulated in accordance with the comparison of said reference signal with said first analog signal, a selectively actuated bipolar switch continuously coupling the second analog signal to the multiplier output, said switch being actuated by the width-modulated pulse train to form at the multiplier output an output pulse train representative of instantaneous power which is width-modulated in accordance with the first analog signal and amplitude modulated in accordance with the second analog signal; summing low-pass filter means to which the outputs of said at least one multiplier are connected for forming a pulse train output representative of average total system power; and an analog-to-pulse rate converter for converting said average total system power pulse train into a series of output pulse signals wherein each pulse is representative of a quantized amount of electrical energy, and means for accumulating said pulses representative of quantized amounts of electrical energy and generating a display proportional to the accumulated quantized amounts of electrical energy.

4. Apparatus in accordance with claim 3 wherein said multiplier includes means for generating an additional second analog signal which is phase shifted 180° with respect to said second analog signal but equal in amplitude thereto, and wherein said bipolar switch comprises an output terminal and first and second input terminals, respective first and second switching elements coupling said first and second input terminals to said output terminal, means coupling said second analog signal to said first input terminal and said additional analog signal to said second input terminal, said first and second switching elements having switching control inputs, and means coupling said width-modulated pulse train to said switching control inputs for controlling switching of same.

5. Apparatus in accordance with claim 4 wherein each of said first and second switching elements comprises a complementary pair of MOS field effect transistors and including coupling means for coupling said width-modulated pulse train to one of the MOS field effect transistors in each pair and an additional means for phase shifting said width-modulated pulse train by 180° and coupling said phase shifted width-modulated pulse train to the other MOS field effect transistor in each complementary pair.

6. Apparatus in accordance with claim 5 wherein said coupling means and said additional coupling means comprise inverters.

7. Apparatus in accordance with claim 6 wherein each of said inverters comprises a pair of complementary MOS field effect transistors.

8. Apparatus in accordance with claim 3 wherein said bipolar switch comprises first and second input terminals, means coupling the second analog signal across said first and second input terminals, an output terminal, and a reference potential terminal, a first switching element coupling said first input terminal to said output terminal, a second switching element coupling said reference potential terminal to said first input terminal, a third switching element coupling said second input terminal to said reference terminal, and a fourth switching element coupling said second input terminal to said output terminal, each of said first, second, third and fourth switching elements having control inputs, and means coupling said width-modulated pulse train to said switching control inputs for controlling switching of same.

9. Apparatus in accordance with claim 8 wherein each of said first, second, third and fourth switching elements comprises a complementary pair of MOS field effect transistors and including first means coupling said width-modulated pulse train to one of the MOS field effect transistors in each pair and second means for phase shifting the width-modulated pulse train by 180° and coupling said phase shifted pulse train to the other transistor in each complementary pair.

10. Apparatus in accordance with claim 9 wherein said first and second means comprises inverters.

11. Apparatus in accordance with claim 3 wherein said means for generating a cyclically varying reference signal comprises an integrator having an input and an output, first and second reference potential sources having equal amplitude and opposite polarity, and switching means for alternately and cyclically coupling said first and second reference potential sources to said integrator input whereby the cyclically varying reference signal is generated at said integrator output.

12. Apparatus in accordance with claim 11 wherein said reference potential source are of constant amplitude so that the output of the integrator comprises an alternately increasing and decreasing ramp signal forming a triangular reference signal.

13. Apparatus in accordance with claim 12 wherein said switching means comprises first and second comparators, said first comparator having said first reference potential coupled to one of its inputs and said second comparator having said second reference potential coupled to one of its inputs, each of said first and second comparators having said integrator output coupled to the other of its inputs, logic means interconnecting the outputs of said first and second comparators, said logic means having first and second outputs which are interconnected so that when one of the first and second outputs is high the other is low and vice versa, switching means having first and second input terminals and an output terminal, means coupling said first and second input terminals to said first and second reference potential sources, respectively, means coupling said switching means output terminal to said integrator input terminal, a first switch element having a control input and coupling said switching means first input terminal to said switching means output terminal, a second switch element having a control input and coupling said switching means second input terminal to said switching means output terminal, and means coupling the first and second outputs of said logic means to said control input of said first and second switch elements, respectively.

14. Apparatus in accordance with claim 13 wherein each of said first and second switch elements comprises a complementary pair of MOS field effect transistors.

\* \* \* \* \*

UNITED STATES PATENT AND TRADEMARK OFFICE
CERTIFICATE OF CORRECTION

PATENT NO. : 3,947,763
DATED : March 30, 1976
INVENTOR(S) : Miran Milkovic

It is certified that error appears in the above-identified patent and that said Letters Patent are hereby corrected as shown below:

Column 3, line 38, delete "Serial No. 396,142" and insert - Serial No. 395,142 -

Signed and Sealed this

Twenty-first Day of June 1977

[SEAL]

Attest:

RUTH C. MASON
Attesting Officer

C. MARSHALL DANN
Commissioner of Patents and Trademarks